(12) United States Patent
Liu et al.

(10) Patent No.: US 12,178,136 B2
(45) Date of Patent: Dec. 24, 2024

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chia-Wei Liu, Tainan (TW); Jia-Feng Fang, Changhua County (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/239,119

(22) Filed: Aug. 28, 2023

(65) Prior Publication Data

US 2023/0403942 A1 Dec. 14, 2023

Related U.S. Application Data

(62) Division of application No. 16/985,206, filed on Aug. 4, 2020, now Pat. No. 11,778,917.

(30) Foreign Application Priority Data

Jul. 7, 2020 (CN) .......................... 202010645397.5

(51) Int. Cl.
*H10N 50/01* (2023.01)
*H10B 61/00* (2023.01)
*H10N 50/80* (2023.01)
*H10N 50/85* (2023.01)

(52) U.S. Cl.
CPC ............. *H10N 50/01* (2023.02); *H10B 61/22* (2023.02); *H10N 50/80* (2023.02); *H10N 50/85* (2023.02)

(58) Field of Classification Search
CPC .......... H10N 50/01; H10N 50/80; H10B 61/22
See application file for complete search history.

(56) References Cited

U.S. PATENT DOCUMENTS

| | | | |
|---|---|---|---|
| 8,492,169 B2 | 7/2013 | Cao | |
| 8,536,063 B2 | 9/2013 | Satoh et al. | |
| 9,153,453 B2 | 10/2015 | Bouet et al. | |
| 2009/0159563 A1* | 6/2009 | Jung | H10N 50/01 216/22 |
| 2012/0142879 A1* | 6/2012 | Nakajima | H01L 21/02282 526/282 |
| 2015/0104882 A1 | 4/2015 | Jung | |
| 2017/0162782 A1* | 6/2017 | Annunziata | H10N 50/01 |
| 2017/0263861 A1 | 9/2017 | Park | |
| 2019/0165258 A1 | 5/2019 | Peng | |
| 2020/0235291 A1 | 7/2020 | Park | |
| 2021/0175412 A1* | 6/2021 | Chern | H10B 61/20 |

* cited by examiner

*Primary Examiner* — Shih Tsun A Chou
(74) *Attorney, Agent, or Firm* — Winston Hsu

(57) ABSTRACT

A method for fabricating semiconductor device includes the steps of forming a magnetic tunneling junction (MTJ) stack on a substrate, performing an etching process to remove the MTJ stack for forming a MTJ, performing a deposition process to form a polymer on a sidewall of the MTJ, and removing the polymer to form a rough surface on the sidewall of the MTJ. Preferably, the MTJ could include a pinned layer on the substrate, a barrier layer on the pinned layer, and a free layer on the barrier layer, in which the rough surface could appear on sidewall of the pinned layer, sidewall of the barrier layer, and/or sidewall of the free layer.

9 Claims, 5 Drawing Sheets

SEMICONDUCTOR DEVICE AND METHOD FOR FABRICATING THE SAME

CROSS REFERENCE TO RELATED APPLICATIONS

This application is a division of U.S. application Ser. No. 16/985,206, filed on Aug. 4, 2020. The content of the application is incorporated herein by reference.

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of forming a magnetic tunneling junction (MTJ) stack on a substrate, performing an etching process to remove the MTJ stack for forming a MTJ, performing a deposition process to form a polymer on a sidewall of the MTJ, and removing the polymer to form a rough surface on the sidewall of the MTJ. Preferably, the MTJ could include a pinned layer on the substrate, a barrier layer on the pinned layer, and a free layer on the barrier layer, in which the rough surface could appear on sidewall of the pinned layer, sidewall of the barrier layer, and/or sidewall of the free layer.

According to another embodiment of the present invention, a semiconductor device includes a magnetic tunneling junction (MTJ) on a substrate, in which a sidewall of the MTJ includes a rough surface. Specifically, the MTJ includes a pinned layer on the substrate, a barrier layer on the pinned layer, and a free layer on the barrier layer, in which the rough surface could appear on sidewalls of the pinned layer, the barrier layer, or the free layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
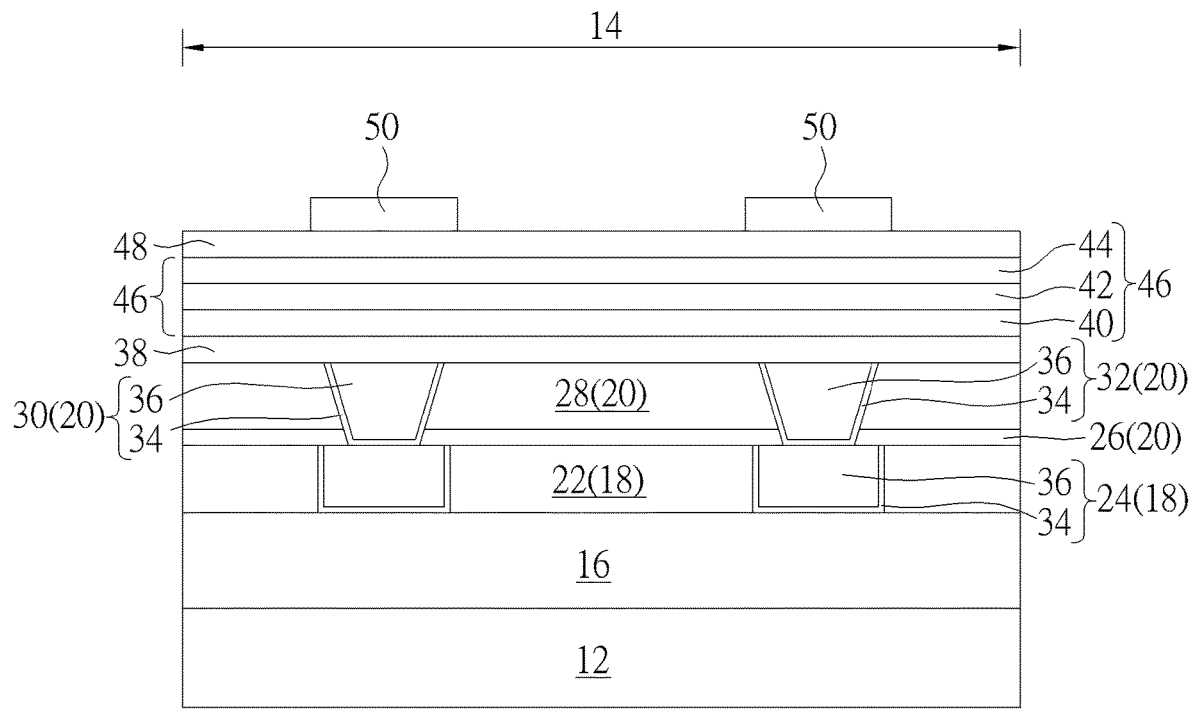
FIGS. 1-4 illustrate a method for fabricating a semiconductor device according to an embodiment of the present invention.

Referring to FIGS. 1-4, FIGS. 1-4 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region (not shown) are defined on the substrate 12.

Active devices such as metal-oxide semiconductor (MOS) transistors, passive devices, conductive layers, and interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 18, 20 are sequentially formed on the ILD layer 16 to electrically connect the aforementioned contact plugs, in which the metal interconnect structure 18 includes an inter-metal dielectric (IMD) layer 22 and metal interconnections 24 embedded in the IMD layer 22, and the metal interconnect structure 20 includes a stop layer 26, an IMD layer 28, and metal interconnections 30, 32 embedded in the stop layer 26 and the 1 MB layer 28.

In this embodiment, each of the metal interconnections 24 from the metal interconnect structure 18 preferably includes a trench conductor and each of the metal interconnections 30, 32 from the metal interconnect structure 20 includes a via conductor. Preferably, each of the metal interconnections 24, 30, 32 from the metal interconnect structures 18, 20 could be embedded within the 1 MB layers 22, 28 and/or stop layer 26 according to a single damascene process or dual damascene process. For instance, each of the metal interconnections 24, 30, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 24 are preferably made of copper, the metal layers 36 in the metal interconnections 30, 32 are preferably made of tungsten, the 1 MB layers 22, 28 are preferably made of silicon oxide or ultra low-k (ULK) dielectric layer, and the stop layers 26 is preferably made of nitrogen doped carbide (NDC), silicon nitride, silicon carbon nitride (SiCN), or combination thereof.

Next, a bottom electrode 38 is formed on the surface of the IMD layer 28, a MTJ stack 46 including a pinned layer 40, a barrier layer 42, and a free layer 44 is formed on the bottom electrode 38, a top electrode 48 is formed on the MTJ stack 46, and a patterned mask 50 such as a patterned resist is formed on the surface of the top electrode 48. Preferably, the free layer 44 could further include a first free layer (not shown) disposed on the barrier layer 42, a stop layer (not shown) disposed on the first free layer, and a second free layer (not shown) disposed on the stop layer.

In this embodiment, the bottom electrode 38 and the top electrode 48 are preferably made of conductive material including but not limited to for example Ta, Pt, Cu, Au, Al, or combination thereof. The pinned layer 40 could be made of ferromagnetic material including but not limited to for example iron, cobalt, nickel, or alloys thereof such as cobalt-iron-boron (CoFeB) or cobalt-iron (CoFe), in which the pinned layer 40 is formed to fix or limit the direction of magnetic moment of adjacent layers. The barrier layer 42 could be made of insulating material including but not limited to for example oxides such as aluminum oxide (AlOx) or magnesium oxide (MgO). The free layer 44 including the first free layer and the second free layer could be made of ferromagnetic material including but not limited to for example iron, cobalt, nickel, or alloys thereof such as cobalt-iron-boron (CoFeB) or nickel-iron (NiFe), in which the magnetized direction of the free layer 44 could be altered freely depending on the influence of outside magnetic field.

Figure 2:
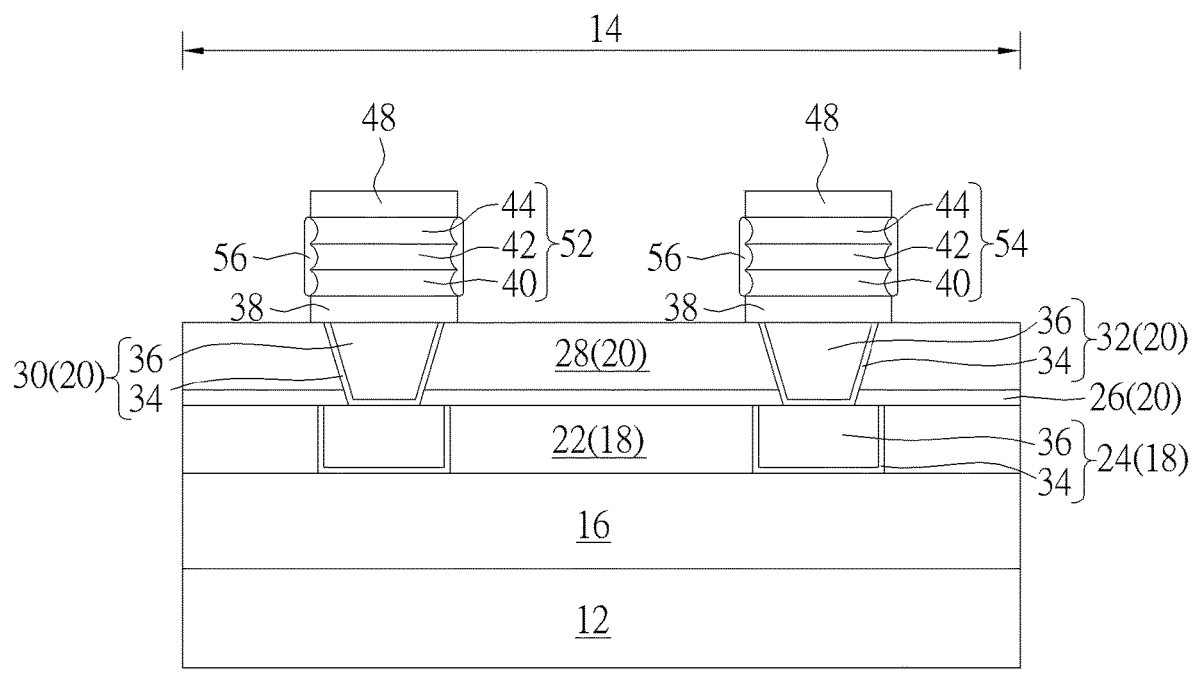

Next, as shown in FIG. 2, an etching process is conducted by using the patterned mask 50 as mask to remove part of the top electrode 48, part of the MTJ stack 46, and part of the bottom electrode 38 to form a plurality of MTJs 52, 54, a deposition process is conducted to form polymers 56 on sidewalls of each of the MTJs 52, 54, and then repeating the aforementioned etching process and deposition process interchangeably. Specifically as etching process and deposition process are conducted repeatedly and interchangeably, the etching process preferably uses hydrochloric acid (HCl) and/or chlorine gas ($Cl_2$) to remove or pattern part of the top electrode 48, part of the MTJ stack 46, and part of the bottom electrode 38 to form MTJs 52, 54 and the deposition process preferably injects chloromethane ($CH_3Cl$) to form polymers 56 on sidewalls of the MTJs 52, 54, in which the polymers 56 preferably include polymers containing carbon bonds and/or hydrogen bonds.

Figure 3:
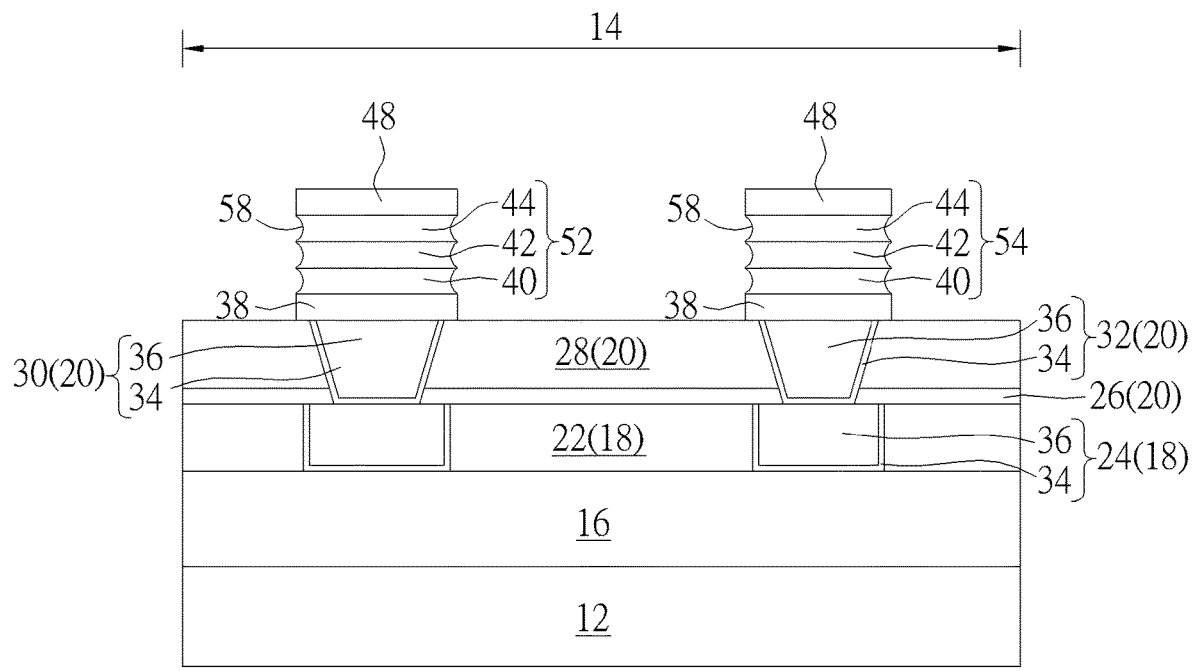

Next, as shown in FIG. 3, another etching process is conducted by using sulfuric acid ($H_2SO_4$) and/or hydrofluoric acid (HF) to completely remove the polymers 56 formed or accumulated during the aforementioned etching process and deposition process. It should be noted that the etching process and deposition process conducted previously further forms rough surfaces 58 on sidewalls of the MTJs 52, 54 and as the polymers 56 are removed the rough surfaces 58 are also exposed. Preferably, the rough surfaces 58 could include different profile or textures depending on the recipe or parameters used during the etching process. For instance, the rough surfaces 58 could include jagged or wavy surfaces in this embodiment, but not limited thereto.

It should be noted that as current approach of using reactive ion etching (RIE) and/or ion beam etching (IBE) process to pattern the MTJ stack 46 for forming MTJs 52, 54 often induces metal ions to re-sputter onto the sidewalls of the MTJs 52, 54 thereby affecting the magnetic performance of the device and increasing the curvature of the top surface of the IMD layer 28 adjacent to two sides of the MTJs 52, 54, the present invention preferably omits the conventional RIE and/or IBE process by repeating the aforementioned etching process of using HCl and/or $Cl_2$ and deposition process of injecting $CH_3Cl$ to pattern the MTJ stack 46 for forming the MTJs 52, 54 and at the same time forms polymers 56 on sidewalls of the MTJs 52, 54 so that the sidewalls of the MTJs 52, 54 could be protected from re-sputter of metal ions from causing damages.

Figure 4:
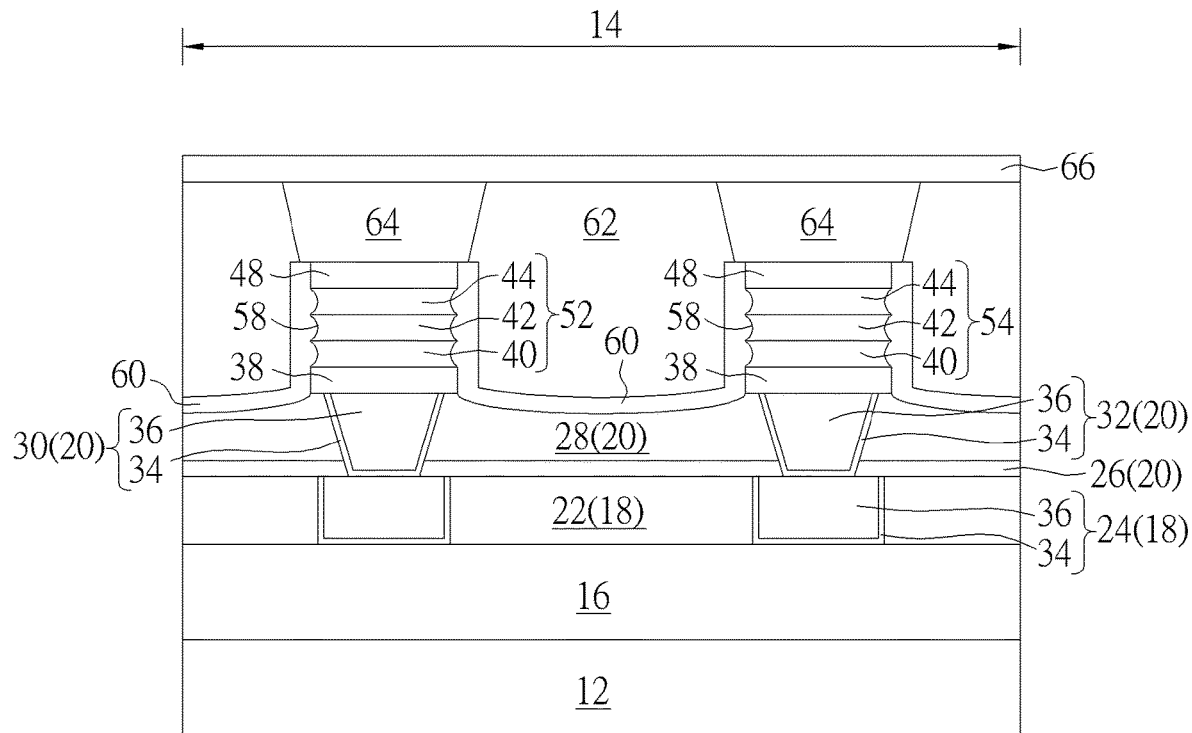

Next, as shown in FIG. 4, a cap layer 60 is formed on the MTJs 52, 54 to cover the surface of the IMD layer 28, an IMD layer 62 is formed on the cap layer 60, and one or more photo-etching process is conducted to remove part of the IMD layer 62 and part of the cap layer 60 to form contact holes (not shown) exposing the top electrodes 48. Next, conductive materials are deposited into the contact holes and planarizing process such as chemical mechanical polishing (CMP) process is conducted to form metal interconnections 64 contacting the top electrodes 48 underneath. Next, another stop layer 66 is formed on the IMD layer 62 and covering the metal interconnections 64.

In this embodiment, the cap layer 60 preferably includes silicon nitride, but could also include other dielectric material including but not limited to for example silicon oxide, silicon oxynitride (SiON), or SiCN depending on the demand of the product. The stop layer 66 could include nitrogen doped carbide (NDC), silicon nitride, silicon carbon nitride (SiCN), and most preferably SiCN. Similar to the aforementioned metal interconnections, the metal interconnections 64 could be formed in the IMD layer 62 according to a single damascene process or dual damascene process. For instance, each of the metal interconnection 64 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). This completes the fabrication of a semiconductor device according to an embodiment of the present invention.

Figure 5:
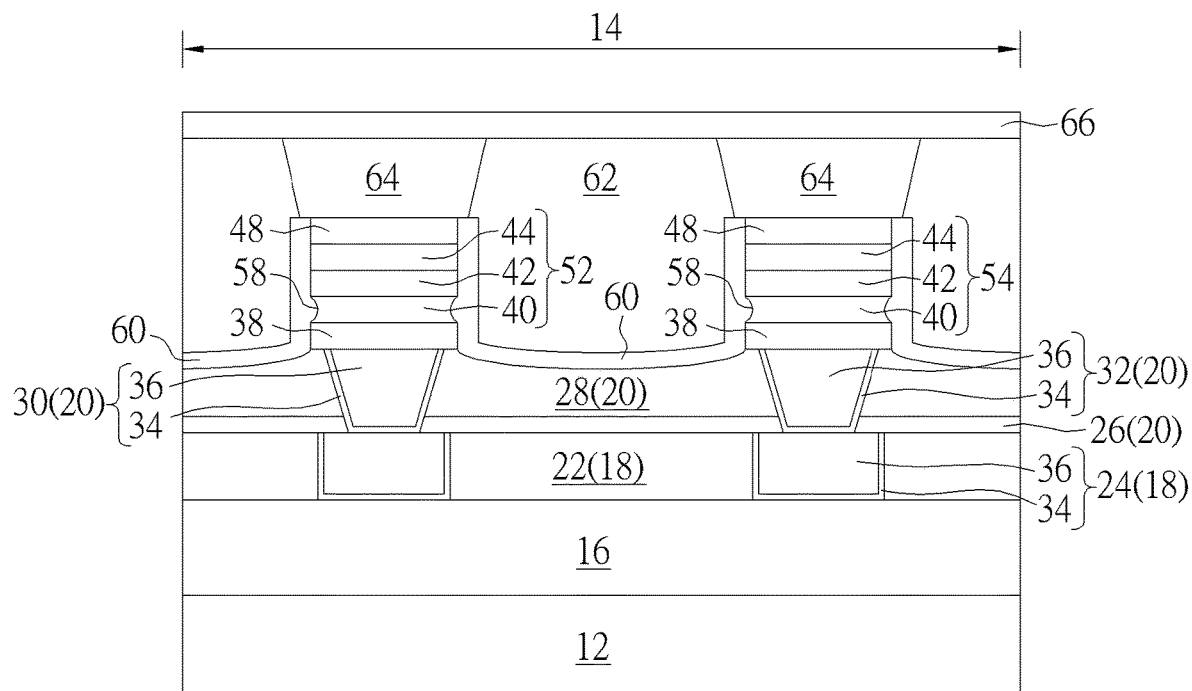
FIGS. 5-10 illustrate structural views of a semiconductor device according to different embodiments of the present invention.
Figure 6:
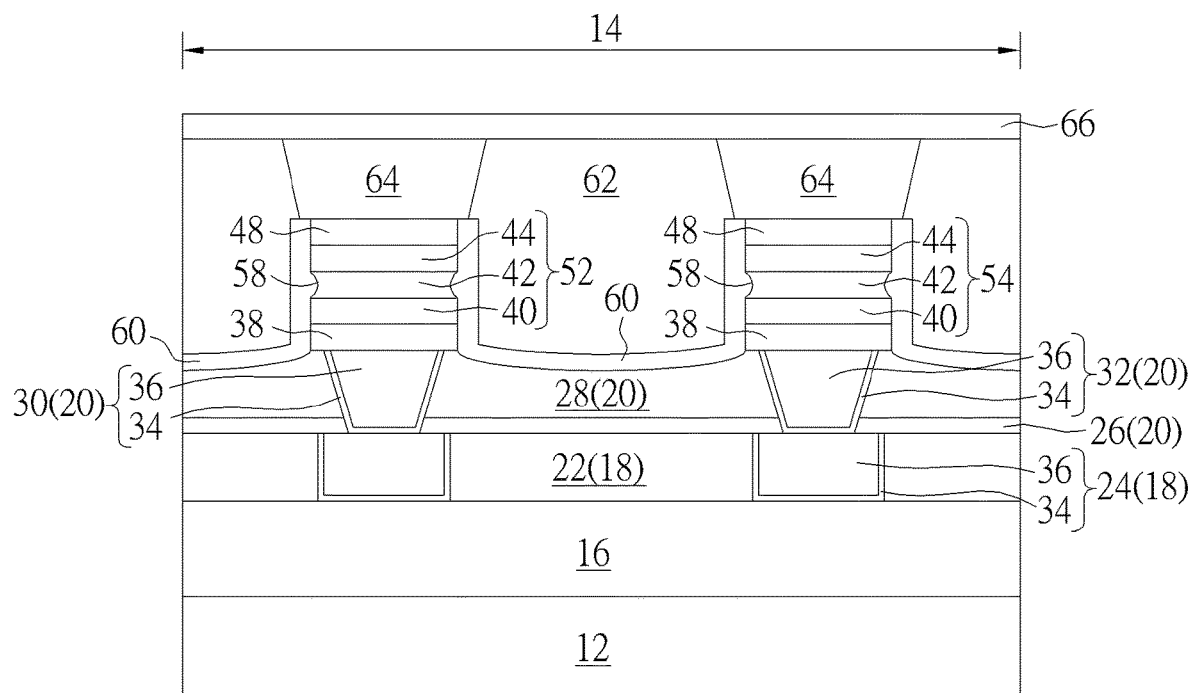
Figure 7:
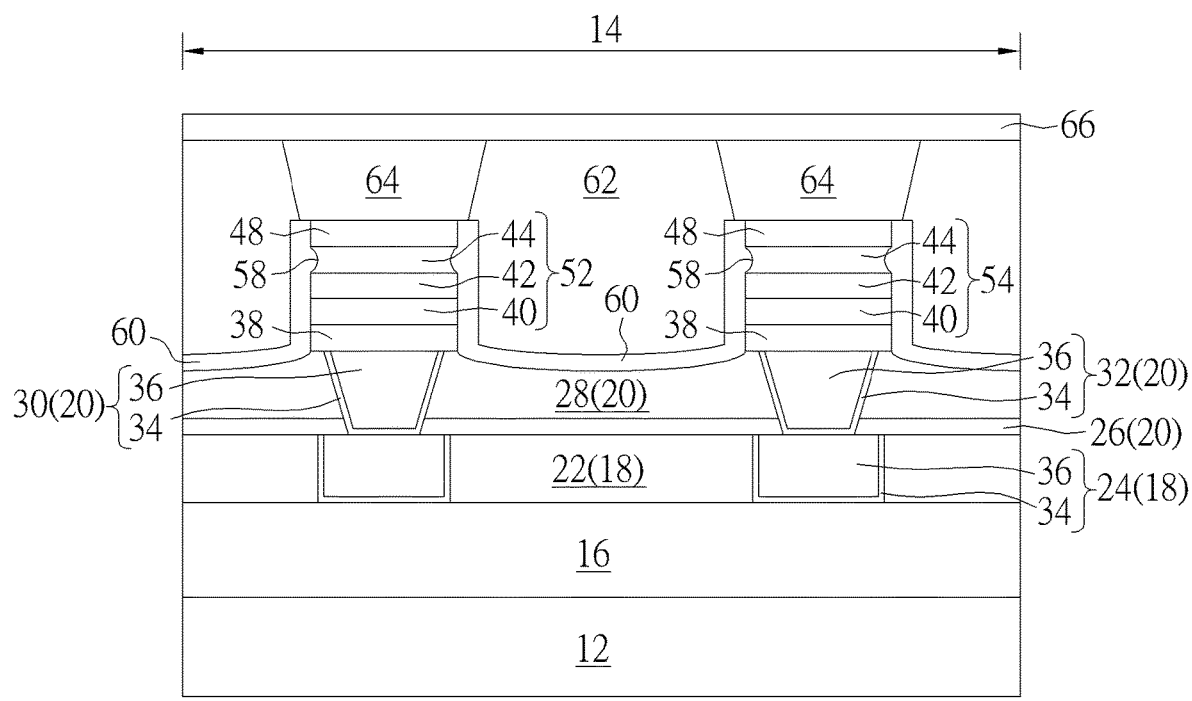

Referring to FIGS. 5-7, FIGS. 5-7 illustrate structural views of a semiconductor device according to different embodiments of the present invention. As shown in FIGS. 5-7, each of the MTJs such as the MTJ 52 is disposed on the substrate 12, a bottom electrode 38 is disposed under the MTJ 52, and a top electrode 48 is disposed on the MTJ 52, in which the MTJ 52 includes a pinned layer 40 on the metal interconnection 30, a barrier layer 42 on the pinned layer 40, a free layer 44 on the barrier layer 42, and rough surfaces 58 on sidewalls of the MTJ 52. Specifically, it would be desirable to adjust the parameter of the etching process so that the rough surfaces 58 only appear on part of the sidewalls of the MTJ 52. For instance, the rough surfaces 58 could only appear on sidewalls of the pinned layer 40 in FIG. 5, the rough surfaces 58 could only appear on sidewalls of the barrier layer 42 in FIG. 6, or the rough surfaces 58 could only appear on sidewalls of the free layer 44 in FIG. 7, which are all within the scope of the present invention.

Figure 8:
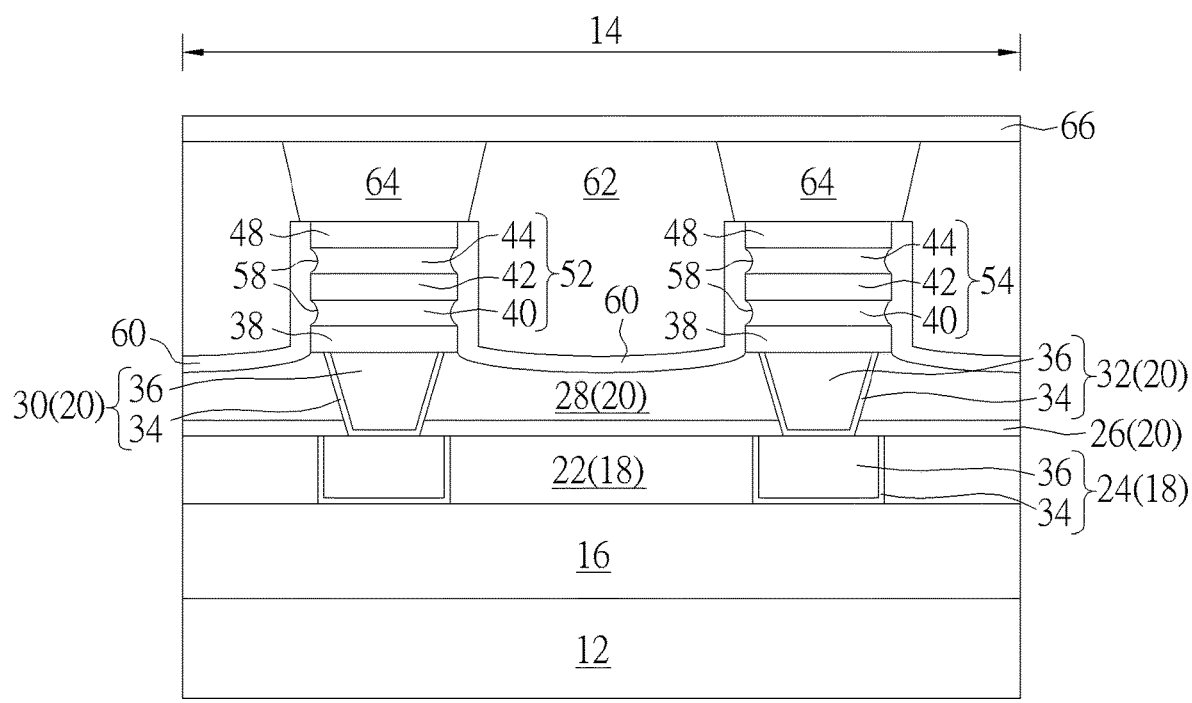
Figure 9:
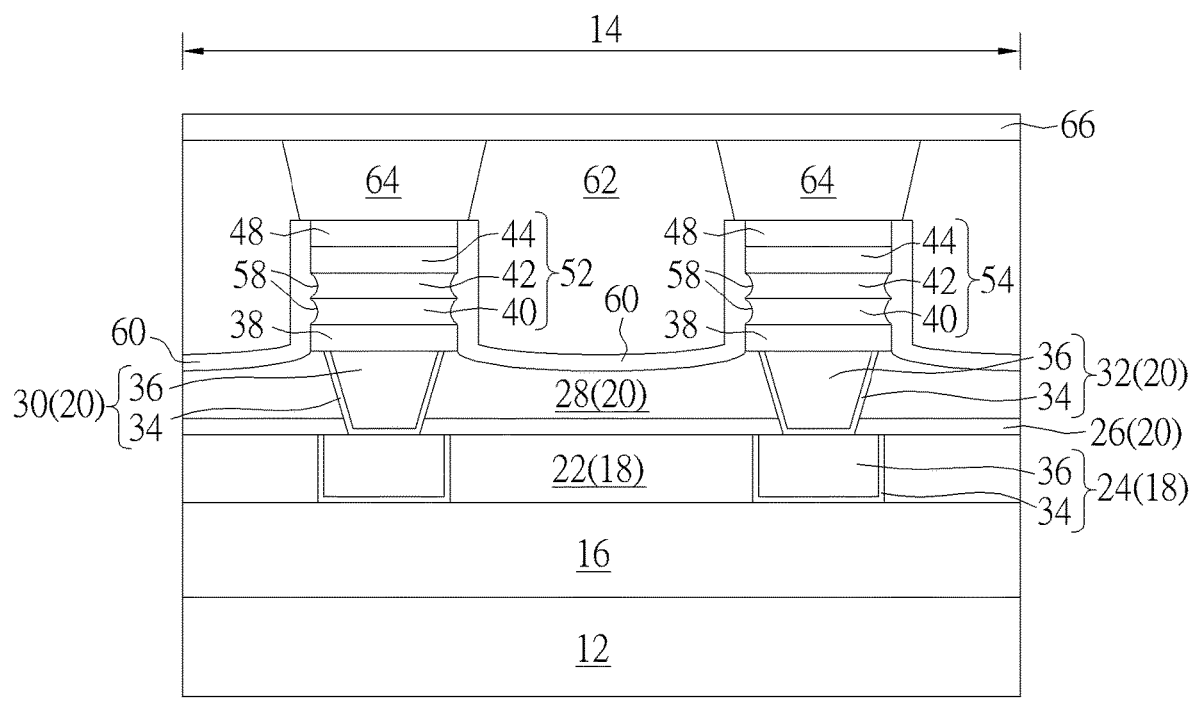
Figure 10:
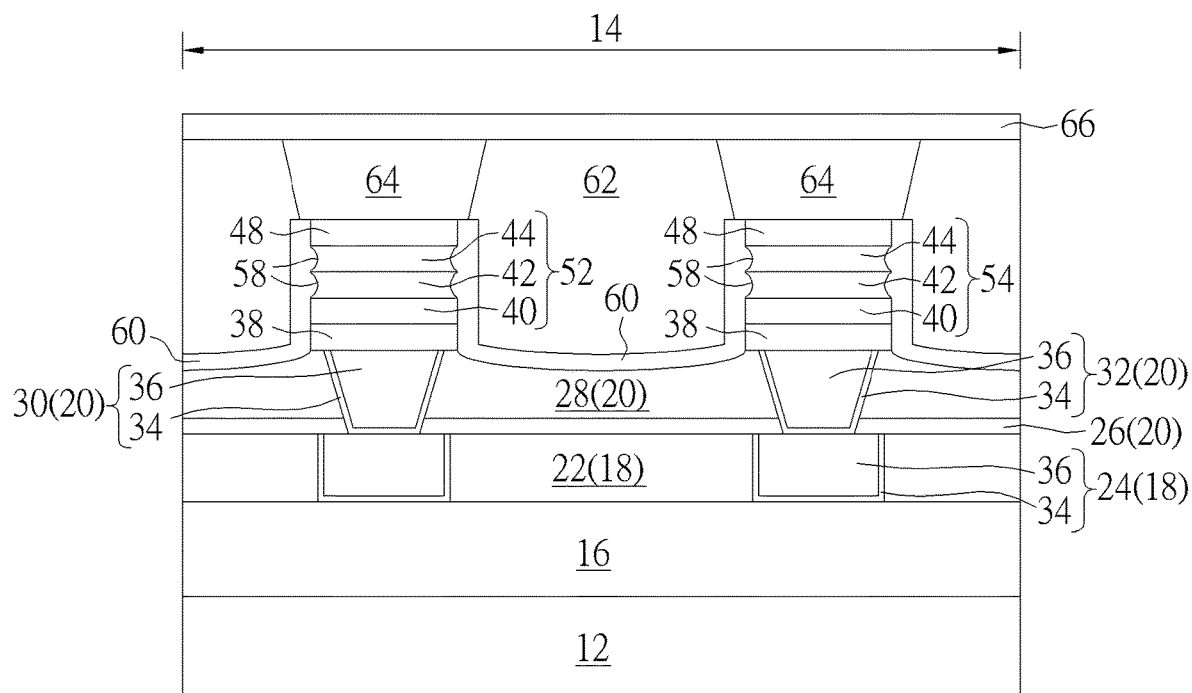

Referring to FIGS. 8-10, FIGS. 8-10 illustrate structural views of a semiconductor device according to different embodiments of the present invention. As shown in FIGS. 8-10, in contrast to rough surfaces 58 only appear on one of the pinned layer 40, barrier layer 42, or free layer 44 as disclosed in the aforementioned embodiment, according to other embodiments of the present invention it would also be desirable to adjust the parameter of the etching process corresponding to each of the material layers so that the rough surfaces 58 could appear on part of the pinned layer 40, barrier layer 42, and/or free layer 44 at the same time. For instance, the rough surfaces 58 could appear on both pinned layer 40 and free layer 44 at the same time while the sidewalls of the of the barrier layer 42 still remained to be planar in FIG. 8, the rough surfaces 58 could appear on both pinned layer 40 and barrier layer 42 at the same time while the sidewalls of the free layer 44 still remained to be planar in FIG. 9, or the rough surfaces 58 could appear on both barrier layer 42 and free layer 40 at the same time while the sidewalls of the pinned layer 40 still remained to be planar in FIG. 10, which are all within the scope of the present invention.

According another embodiment of the present invention, in contrast to that the rough surfaces 58 only appear on sidewalls of the MTJs 52, 54, it would also be desirable to adjust the parameter or selectivity of the etching process so that the rough surfaces could appear not only on sidewalls of the MTJs 52, 54 but also on sidewalls of the bottom electrodes 38 and/or top electrodes 48, which are all within the scope of the present invention.

Overall, since the current approach of using reactive ion etching (RIE) and/or ion beam etching (IBE) process to pattern the MTJ stack 46 for forming MTJs 52, 54 often induces metal ions to re-sputter onto the sidewalls of the MTJs 52, 54 thereby affecting the magnetic performance of the device and increasing the curvature of the top surface of the 1 MB layer 28 adjacent to two sides of the MTJs 52, 54, the present invention preferably omits the conventional RIE and/or IBE process by repeating the aforementioned etching process of using HCl and/or $Cl_2$ and deposition process of injecting $CH_3Cl$ to pattern the MTJ stack 46 for forming the MTJs 52, 54 and at the same time forms polymers 56 on sidewalls of the MTJs 52, 54 so that the sidewalls of the MTJs 52, 54 could be protected from re-sputter of metal ions from during the patterning process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a magnetic tunneling junction (MTJ) stack on a substrate;
   (a) performing an etching process to remove part of the MTJ stack for forming an MTJ, the MTJ consisting of a pinned layer, a barrier layer on the pinned layer, and a free layer on the barrier layer; and
   (b) performing a deposition process to form a polymer on a sidewall of the MTJ, wherein top surfaces of the polymer and the MTJ are coplanar.

2. The method of claim 1, further comprising repeating steps (a) and (b).

3. The method of claim 1, wherein the etching process comprises hydrochloric acid (HCl) or chlorine gas.

4. The method of claim 1, wherein the deposition process comprises chloromethane ($CH_3Cl$).

5. The method of claim 1, further comprising removing the polymer to form a rough surface on the sidewall of the MTJ.

6. The method of claim 5, further comprising using sulfuric acid and hydrogen fluoride to remove the polymer.

7. The method of claim 5, wherein the rough surface comprises a jagged surface.

8. The method of claim 5, further comprising:
   forming a bottom electrode under the MTJ; and
   forming a top electrode on the MTJ.

9. The method of claim 8, wherein a sidewall of the bottom electrode comprises the rough surface.

* * * * *